United States Patent
You et al.

(10) Patent No.: US 11,111,321 B2
(45) Date of Patent: Sep. 7, 2021

(54) PHOTOCROSSLINKABLE NEUTRAL ELECTROCHROMIC POLYMERS AND METHOD FOR PREPARING SAME

(71) Applicant: Ambilight Inc., Grand Cayman (KY)

(72) Inventors: Liyan You, West Lafayette, IN (US); Jiazhi He, Shenzhen (CN); Jianguo Mei, West Lafayette, IN (US)

(73) Assignee: AMBILIGHT INC., Grand Cayman (KY)

( * ) Notice: Subject to any disclaimer, the term of this patent is extended or adjusted under 35 U.S.C. 154(b) by 0 days.

(21) Appl. No.: 16/942,000

(22) Filed: Jul. 29, 2020

(65) Prior Publication Data

US 2020/0369801 A1    Nov. 26, 2020

Related U.S. Application Data

(63) Continuation of application No. PCT/US2019/058594, filed on Oct. 29, 2019.

(60) Provisional application No. 62/752,540, filed on Oct. 30, 2018.

(51) Int. Cl.
| | |
|---|---|
| *C08F 28/06* | (2006.01) |
| *C08F 4/70* | (2006.01) |
| *C08F 228/06* | (2006.01) |
| *C08G 61/12* | (2006.01) |
| *C08G 75/06* | (2006.01) |

(52) U.S. Cl.
CPC .............. *C08F 28/06* (2013.01); *C08F 4/70* (2013.01); *C08F 228/06* (2013.01); *C08G 61/12* (2013.01); *C08G 61/126* (2013.01); *C08G 75/06* (2013.01)

(58) Field of Classification Search
CPC .............. C08G 61/123; C08G 61/126; C08G 2261/12; C08G 2261/228; C08G 2261/312; C08G 2261/314; C08G 2261/3246; C08G 2261/3243; C08G 2261/3241; C08G 2261/3242; C08G 2261/54; C09K 9/02; C09K 2211/1491; C09K 2211/1483; C09K 2211/1458; C09K 2211/1466; C09K 2211/145; C09K 2211/1425; C09K 2211/1416

See application file for complete search history.

(56) References Cited

U.S. PATENT DOCUMENTS

| 8,404,800 B2 | 3/2013 | Beaujuge et al. |
| 9,243,111 B2 | 1/2016 | Choi |
| 2005/0202274 A1 | 9/2005 | Elschner et al. |
| 2011/0046330 A1* | 2/2011 | Beaujuge .............. C08G 61/123 526/257 |

OTHER PUBLICATIONS

Reynolds et al. (Adv. Funct. Mater. 2013, 23, 3728-3737).*

(Continued)

*Primary Examiner* — Shane Fang
(74) *Attorney, Agent, or Firm* — Sheppard Mullin Richter & Hampton LLP

(57) ABSTRACT

Various photocrosslinkable electrochromic polymers are disclosed. The polymers are suitable for an electrochromic layer of an electrochromic device. The polymers are formed with a two-step synthesis method that includes forming a polymer precursor with one or more chromophore blocks, and mixing the polymer precursor with photocrosslinkable monomer units to form the polymer.

16 Claims, 8 Drawing Sheets

+

Electrochromic Polymer precursor        Photocrosslinkable Monomer Unit

Photocrosslinkable Electrochromic Polymer

(56) References Cited

OTHER PUBLICATIONS

Krebs, J. Mater. Chem. C, 2013, 1,4826-35.*
PCT International Search Report and the Written Opinion dated Jan. 14, 2020, issued in related International Application No. PCT/US2019/058594 (6 pages).
Jacob Jensen et al. "Direct Photopatterning of Electrochromic Polymers", Advanced Functional Materials, 2013, vol. 23, pp. 3728-3737. Abstract—p. 3729, col. 2, para 3 to p. 3730, col. 2, para 1, Scheme 1.
Yohei Fujinami et al. "Synthesis of Thiophene- and Bithiophene-Based Alternating Copolymers via Pd-Catalyzed Direct C—H Arylation", ACS Macro Lett. 2012 , vol. 1(1), pp. 67-70. Abstract.
Jeonghun Kim et al., "Solution Processable and Patternable Poly(3,4-alkylenedioxythiophene)s for Large-Area Electrochromic Films", Advanced Materials, vol. 23, 2011, pp. 4168-4173.
Michael T. Otley et al., "Acrylated Poly(3,4-propylenedioxythiophene) for Enhancement of Lifetime and Optical Properties for Single-Layer Electrochromic Devices", ACS Applied Materials & Interfaces, vol. 6, 2014, pp. 1734-1739.

* cited by examiner

PHOTOCROSSLINKABLE NEUTRAL ELECTROCHROMIC POLYMERS AND METHOD FOR PREPARING SAME

REFERENCE TO RELATED APPLICATIONS

The present application is a continuation of International Application No. PCT/US2019/058594, filed Oct. 29, 2019, which claims priority to U.S. Provisional Application No. 62/752,540, filed on Oct. 30, 2018, entitled "Photocrosslinkable Neutral Black Electrochromic Polymers—the Preparation Method and Using the same," the contents of which are incorporated herein by reference in their entirety.

TECHNICAL FIELD

The present disclosure is generally related to polymers and methods for preparing the polymers, and more particularly, directed to photocrosslinkable electrochromic polymers and methods for preparing the photocrosslinkable electrochromic polymers.

BACKGROUND

Low energy consumption electrochromic devices (ECDs) have been widely applied to different applications such as rearview mirrors, information displays, ski googles, transmissive displays, camera apertures and windshields. To meet the need for a variety of applications, electrochromic conjugated polymers (ECPs) are required to be printed in custom patterns with a different transmittance in the colored state. However, sophisticated coating and lithography techniques would increase the cost of the final products. A roll-to-roll photolithography process is an appealing low-cost technique to create a desired pattern on flexible substrates. For that, ECPs with photocrosslinkable functional groups are required.

Electrochromic polymers containing acrylate-substituted repeat units have proven to be photocrosslinkable. For instance, Reynolds (Adv. Funct. Mater. 2013, 23, 3728-3737) and Kim (Adv. Mater. 2011, 23, 4168-4173) have reported the acrylate-substituted propylenedioxythiophene (ProDOT) polymers which can be used for direct photopatterning. Another reported methacrylate substituted ProDOT polymer (ACS Appl. Mater. Interfaces 2014, 6 (3), 1734-1739) has demonstrated to increase the lifetime of the devices after crosslinking, but due to the adopted electrodeposition technique, this blue polymer cannot be used for direct photopatterning. However, most of the previously developed acrylated ECPs are homopolymers which does not present a broadly absorbing black color that is one of the widely accepted colors in the industries for the various applications.

Moreover, the previously reported methods cannot be used to make photocrosslinkable black electrochromic polymers, because the presence of acrylate functional group precludes the use of palladium catalyst cross-coupling polymerizations (i.e. C-H arylation, Stille coupling, and Suzuki coupling)—a commonly used method to make black electrochromic polymers, as side reactions are prominent and inhibit the polymerization. A synthesis route to incorporate acrylated functional groups into ECPs with controlled hue is highly desired. Other than the hue of the ECPs, it was found that the formation of the highly crosslinked network of the pure acrylated ECPs experienced the twisting of the conjugated backbone, resulting in losing their electrochromic properties.

SUMMARY

Described herein are photocrosslinkable electrochromic polymers and methods for preparing the photocrosslinkable electrochromic polymers.

In one aspect, the disclosure describes a polymer comprising a formula of:

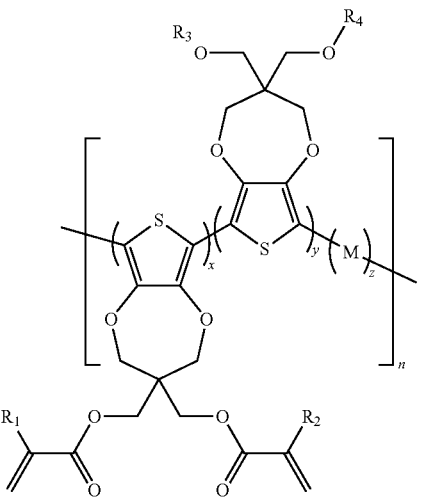

wherein n is an integer greater than 0; x is an integer greater than 0; y is an integer greater than 0; z is an integer greater than 0; M is a monomer unit; and each of $R_1$, $R_2$, $R_3$ and $R_4$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl. The values of x, y and z may indicate ratios of three monomer units, but not necessarily the real monomer sequence in the polymer.

In some embodiments, M is selected from a group including:

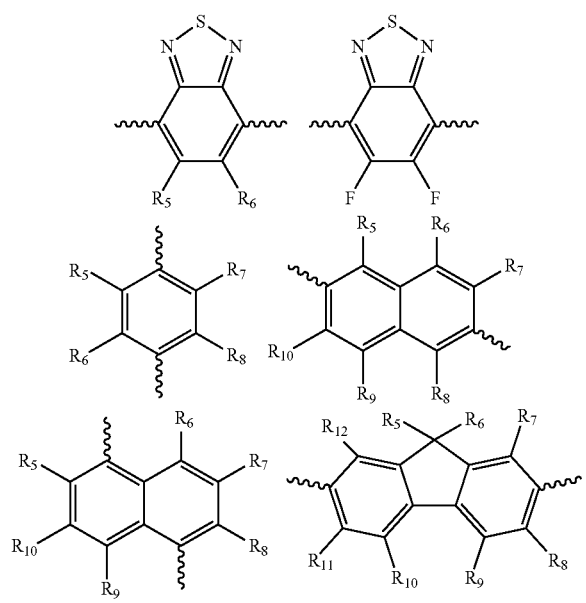

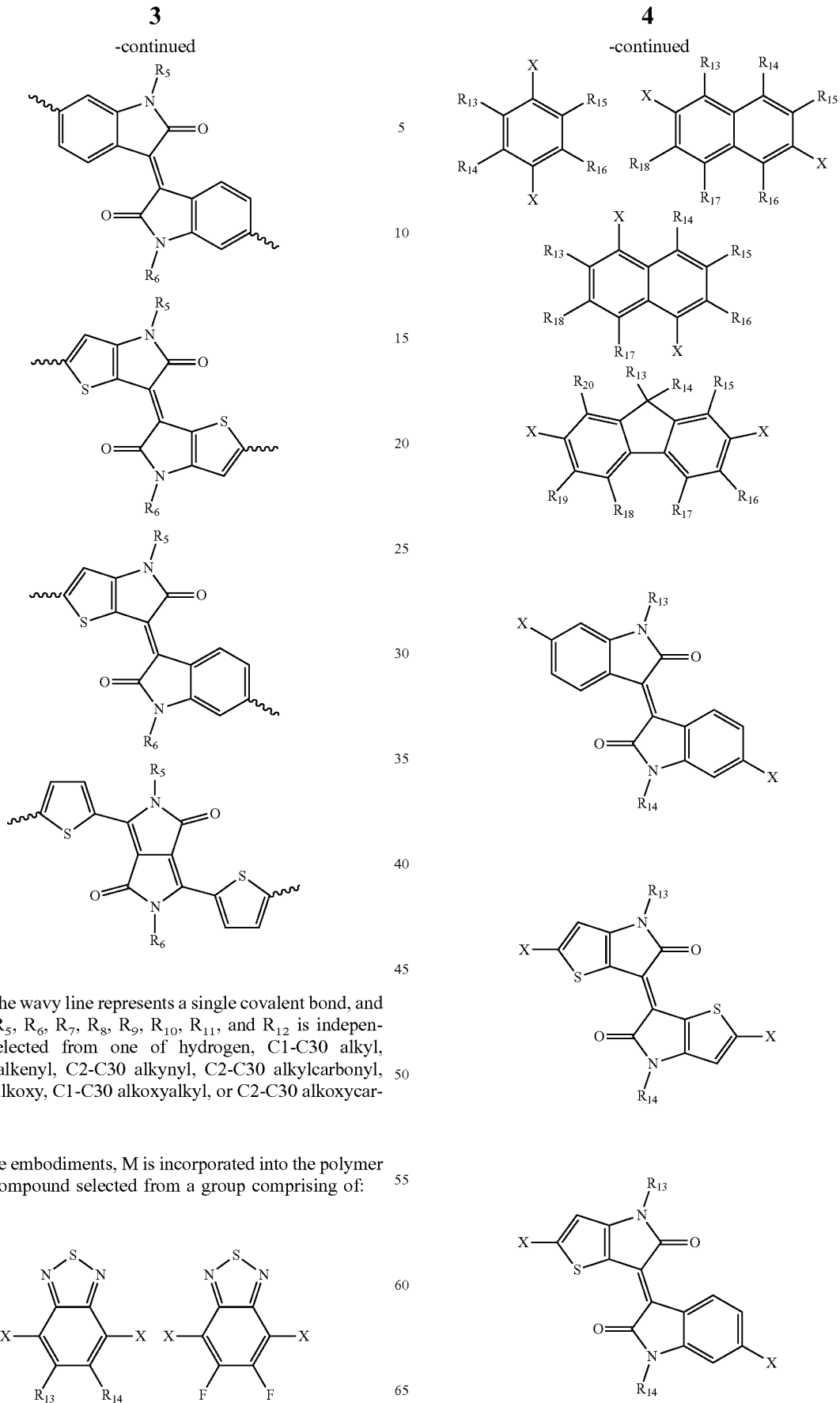
wherein the wavy line represents a single covalent bond, and each of $R_5$, $R_6$, $R_7$, $R_8$, $R_9$, $R_{10}$, $R_{11}$, and $R_{12}$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl.
In some embodiments, M is incorporated into the polymer using a compound selected from a group comprising of:

-continued

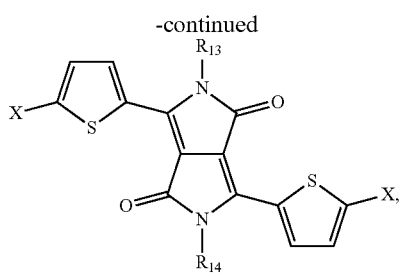

X = Cl, Br, I wherein X is selected from one of Cl, Br, or I; and each of $R_{13}$, $R_{14}$, $R_{15}$, $R_{16}$, $R_{17}$, $R_{18}$, $R_{19}$, and $R_{20}$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl.

In some embodiments, a number average molecular weight of the polymer ranges from 2,000 to 200,000 Da. In some embodiments, n ranges from 1 to 260.

In another aspect, the disclosure describes a polymer comprising a formula of:

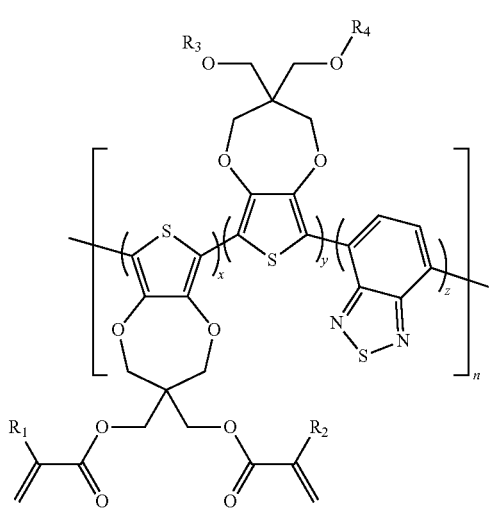

wherein n is an integer greater than 0; x is an integer greater than 0; y is an integer greater than 0; z is an integer greater than 0; and each of $R_1$, $R_2$, $R_3$ and $R_4$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl. In some embodiments, the values of x, y and z may indicate ratios of three monomer units, but not necessarily the real monomer sequence in the polymer. In some embodiments, the polymer is black color when $0<x/(y+z)\leq 0.6$ and $2\leq y/z\leq 9$. In some embodiments, a number average molecular weight of the polymer ranges from 2,000 to 200,000 Da.

In another aspect, the disclosure describes a method for forming a polymer. The method includes forming a polymer precursor with one or more chromophore blocks, and mixing the polymer precursor with photocrosslinkable monomer units to form the polymer.

In some embodiments, forming the polymer precursor with the one or more chromophore blocks includes a reaction of:

forming the polymer precursor with the one or more chromophore blocks comprises contacting the following monomers, IA, IB, and IC:

IA
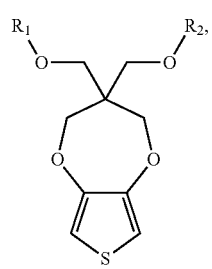

IB
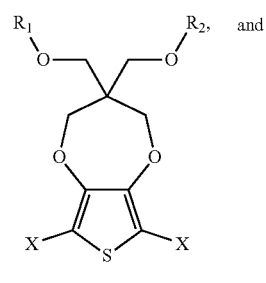
and

IC
X—M—X, under first reaction conditions sufficient to provide a polymer precursor of formula ID:

ID
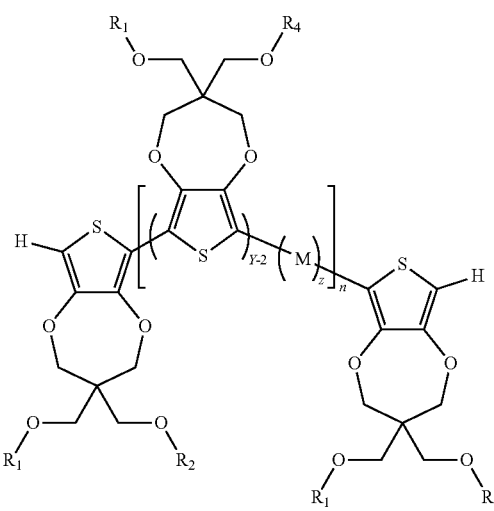

wherein X is selected from one of Cl, Br, or I; n is an integer greater than 0; Y is an integer greater than 2; z is an integer greater than 0; M is a monomer unit; and each of $R_1$ and $R_2$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl. In some embodiments, the values of x, y and z may indicate ratios of three monomer units, but not necessarily the real monomer sequence in the polymer.

In some embodiments, the first reaction conditions comprise a palladium catalyst, a ligand, a base, and a first solvent. Heating may be needed. Heating temperature may be in the range from 0° C. to 200° C. or 50° C. to 160° C.

In some embodiments, the palladium catalyst is selected from one or more of a palladium(II) catalyst, a palladium(0) catalyst, palladium acetate, bis(triphenylphosphine) palladium(II) dichloride, tetrakis(triphenylphosphine) palladium(0), tris(dibenzylideneacetone) dipalladium(0), palladium chloride or any currently known or later developed.

In some embodiments, the ligand is selected form one or more of pivalic acid, benzoic acid, 2,2-Dimethylhexanoic acid, 2,2-dimethyl-heptanoic acid, 2,2-dimethyloctanoic acid, or an organic acid without an alpha hydrogen.

In some embodiments, the base is selected from one or more of sodium carbonate, potassium carbonate, cesium carbonate, and a base containing an alkali metal.

In some embodiments, the first solvent is selected form one or more of dimethylformamide, dimethylacetamide, n-methyl-2-pyrrolidone, tetrahydrofuran, 2-methyltetrahydrofuran, toluene, dimethylbenzene, or a polar aprotic solvent.

In some embodiments, mixing the polymer precursor with the photocrosslinkable monomer units comprises contacting the polymer precursor of formula ID with a photocrosslinkable monomer of formula IE:

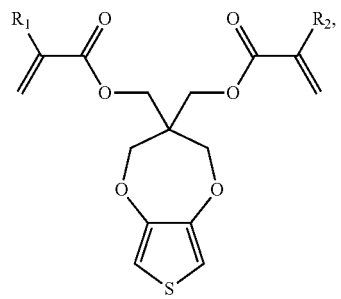

under second reaction conditions sufficient to form the polymer, wherein the polymer is of formula:

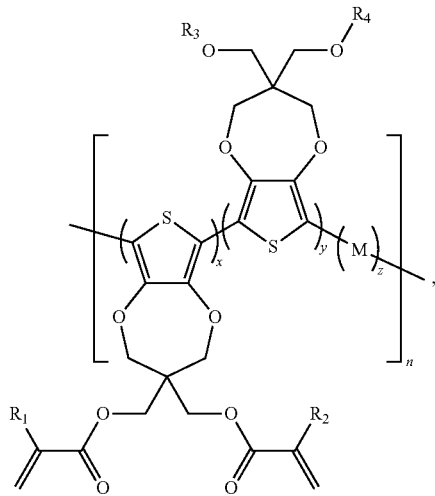

wherein x is an integer greater than 0; y is an integer greater than 0; and each of $R_1$, $R_2$, $R_3$ and $R_4$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl. In some embodiments, the values of x, y and z may indicate ratios of three monomer units, but not necessarily the real monomer sequence in the polymer.

In some embodiments, the second reaction conditions comprise an oxidant and a second solvent.

In some embodiments, the second solvent is selected form one or more of chloroform, dichloromethane, nitromethane, toluene, or an aprotic solvent.

In some embodiments, the oxidant is selected from one or more of dibenzoyl peroxide, di-tert-butyl peroxide, an iron (III) salt, peroxide salt, or persulfate salt. In some embodiments, the iron(III) salt includes one or more of iron(III) chloride, iron(III) bromide, iron(III) sulfate, or iron(III) nitrate.

In some embodiments, forming the polymer precursor with the one or more chromophore blocks comprises contacting monomers:

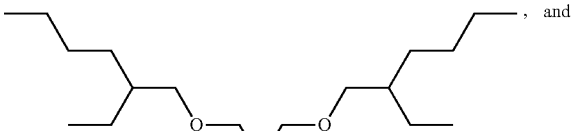

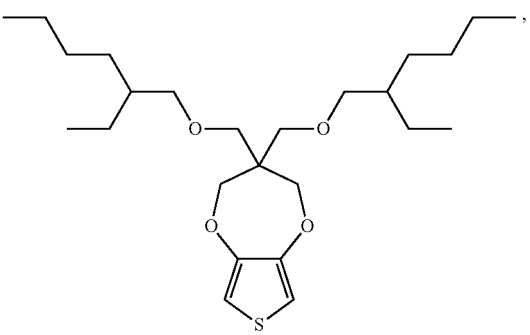

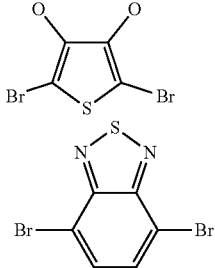

to form the polymer precursor of formula:
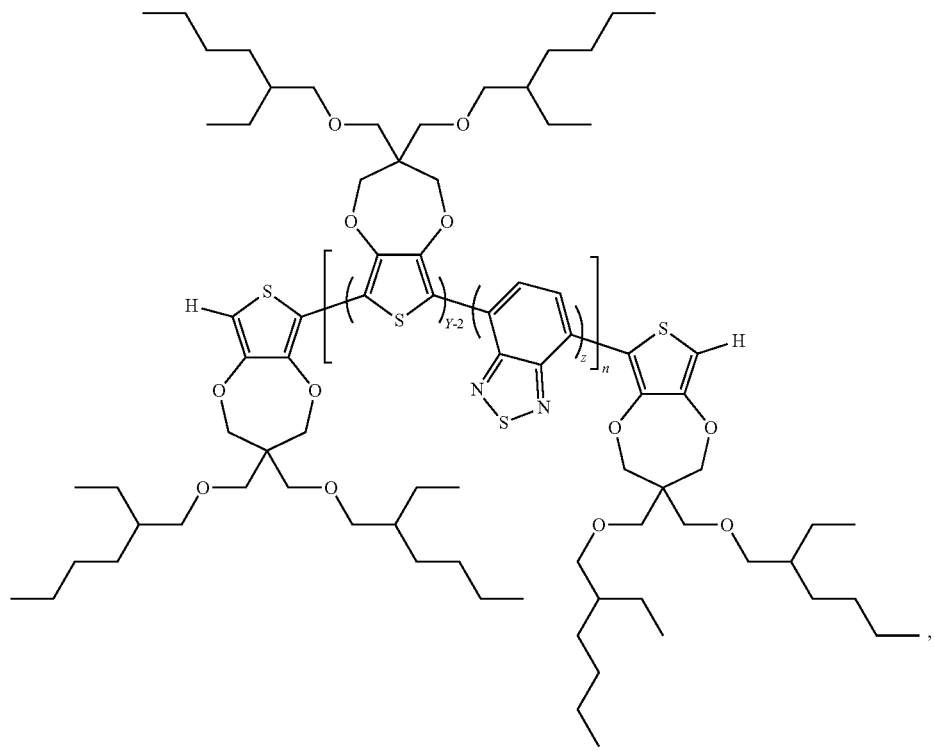
wherein n is an integer greater than 0; Y is an integer greater than 2; z is an integer greater than 0.
In some embodiments, mixing the polymer precursor with the photocrosslinkable monomer units comprises contacting the above polymer precursor with a monomer of formula:
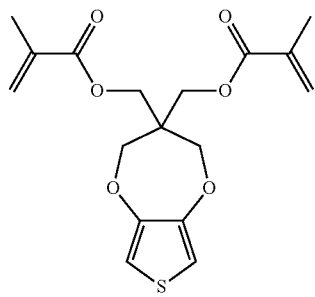
to form the polymer of formula:

wherein x is an integer greater than 0; y is an integer greater than 0. When $0<x/(y+z)\leq0.6$ and $2\leq y/z\leq9$, the polymer is black color. In some embodiments, the values of x, y and z may indicate ratios of three monomer units, but not necessarily the real monomer sequence in the polymer. The polymers may be formed from a random polymerization, which do not have accurate repeat units.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings below.

DETAILED DESCRIPTION OF EMBODIMENTS

In the following description, certain specific details are set forth in order to provide a thorough understanding of various embodiments of the invention. However, one skilled in the art will understand that the invention may be practiced without these details. Moreover, while various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way.

Unless the context requires otherwise, throughout the present specification and claims, the word "comprise" and variations thereof, such as, "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it were individually recited herein. Additionally, the singular forms "a," "an" and "the" include plural referents unless the context clearly dictates otherwise.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment, but may be in some instances. Furthermore, the particular features, structures, or characteristics may be combined in any suitable manner in one or more embodiments.

Various embodiments described herein are directed to polymers and methods for preparing the polymers, and more particularly, directed to photocrosslinkable electrochromic polymers and methods for preparing the photocrosslinkable electrochromic polymers. In some embodiments, a new strategy is proposed to limit the ratio of crosslinking units in ECPs while forming a crosslinking network for photolithography applications. This crosslinking strategy not only can assist with the photolithography application, but also can benefit the cycle stability (reliability) of the ECPs. Delamination of the hydrophobic thin-films of ECPs may occur when immersed in the polar electrolytes, e.g. propylene carbonates, acetonitrile, ethyl carbonate. The crosslinking of the ECPs can increase the adhesion of the thin films on the ITO/glass substrate, resulting in a better cycle stability.

Figure 1:
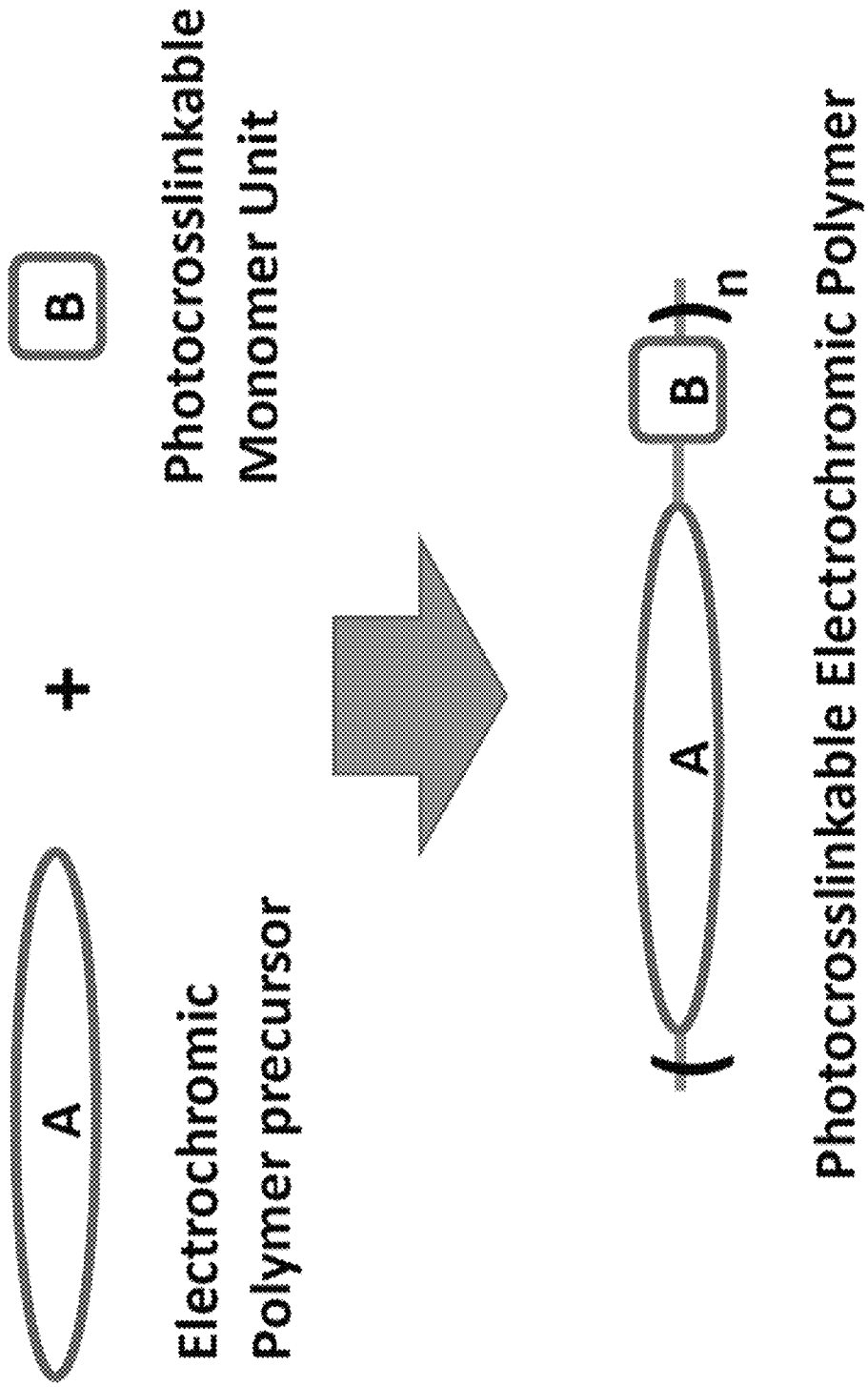
FIG. 1 is a flow diagram illustrating a two-step method for forming a polymer, according to one example embodiment.

Embodiments will now be explained with accompanying figures. Reference is first made to FIG. 1. FIG. 1 is a flow diagram illustrating a two-step method for forming a polymer, according to one example embodiment. In some embodiments, a two-step method may be employed to prepare photocrosslinkable ECPs. The first step includes synthesizing a polymer precursor (unit A) with chromophore blocks, and the second step includes mixing the polymer precursor (unit A) with one or more photocrosslinkable units (unit B) to form a photocrosslinkable electrochromic polymer. Unit A is a polymer precursor with chromophore blocks which can adjust the color of the final polymer. Unit B is a photocrosslinkable unit which can introduce photocrosslinkable property to the polymer. In some instances, in the second step, oxidative polymerization is employed to copolymerize the polymer precursor with photocrosslinkable units to make a photocrosslinkable ECP. This two-step method may be applied to prepare photocrosslinkable black ECPs and photocrosslinkable ECPs with other colors.

Different forms of photocrosslinkable electrochromic polymers may be prepared by the above two-step synthesis method. The following scheme shows a structure of an example photocrosslinkable electrochromic polymer:

Polymer I

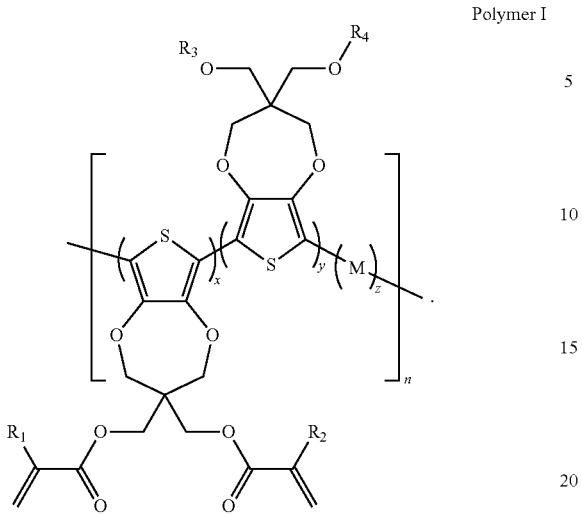

In Polymer I, n is an integer greater than 0 (e.g., with a range of 1 to 260). A number average molecular weight (Mn) of Polymer I ranges from 2,000 to 200,000 Da. Each of $R_1$, $R_2$, $R_3$, and $R_4$ may be independently selected from one of hydrogen, C1-C30 alkyl, C2-C30 alkenyl, C1-C30 alkynyl, C2-C30 alkylcarbonyl, C1-C30 alkoxy, C1-C30 alkoxyalkyl, or C1-C30 alkoxycarbonyl. Further, in Polymer I, x is an integer greater than 0; y is an integer greater than 0; and z is an integer greater than 0. In some embodiments, the values of x, y and z may indicate ratios of different monomers, but not necessarily the real monomer sequence in the polymer. The polymer may be formed from a random polymerization such that the repeat units are not strictly alternating. 'M' represents a monomer, which can be selected from one of the following compounds:

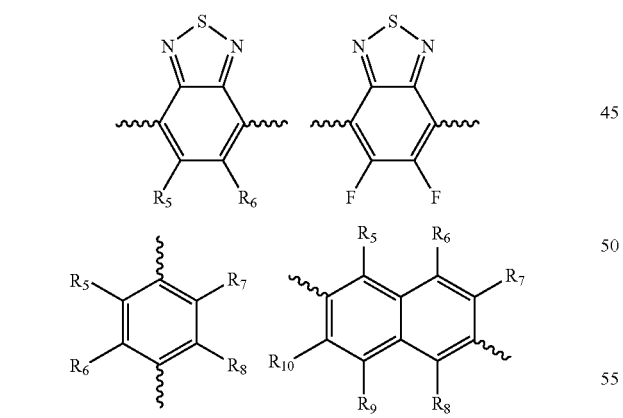

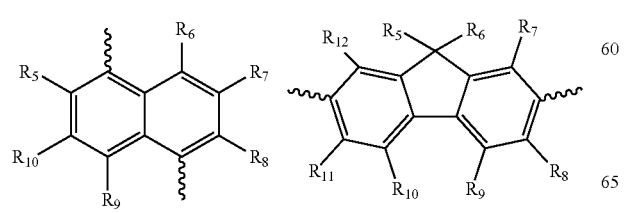

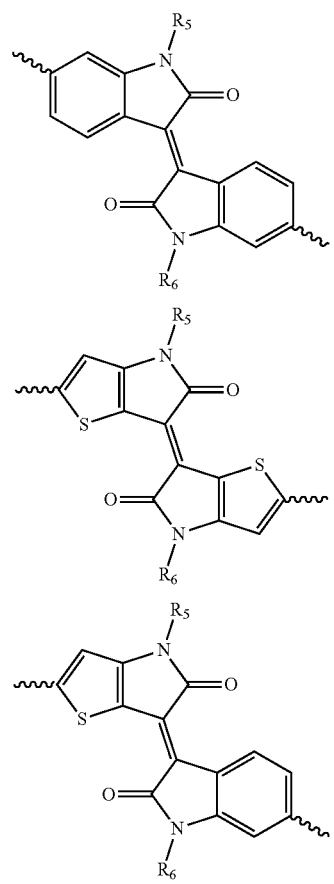

wherein each of $R_5$, $R_6$, $R_7$, $R_8$, $R_9$, $R_{10}$, $R_{11}$, and $R_{12}$ may be independently selected from one of hydrogen, C1-C30 alkyl, C2-C30 alkenyl, C1-C30 alkynyl, C2-C30 alkylcarbonyl, C1-C30 alkoxy, C1-C30 alkoxyalkyl, or C1-C30 alkoxycarbonyl.

In some embodiments, M is incorporated into the polymer using a compound selected from a group comprising of:

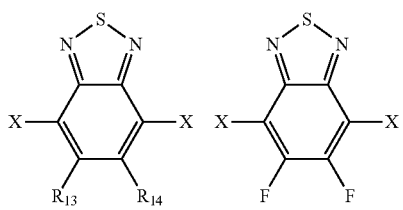

-continued

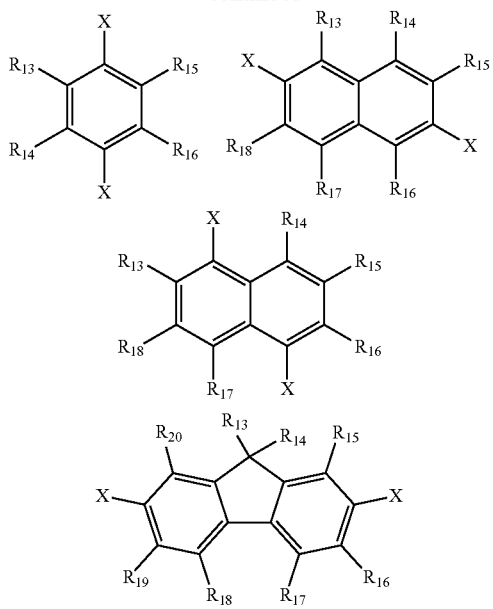

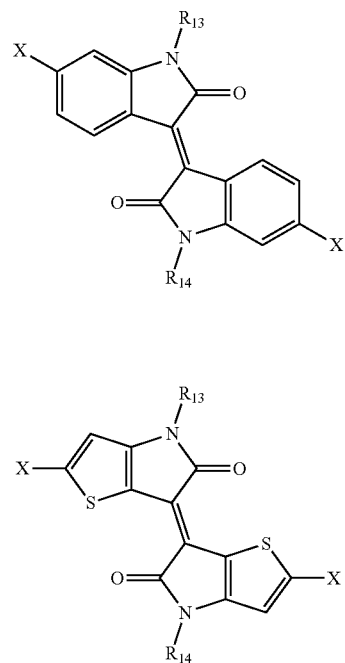

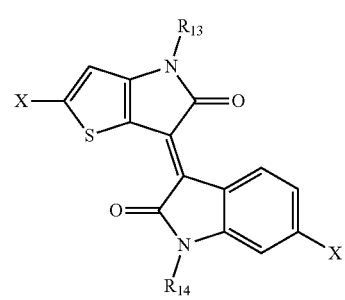

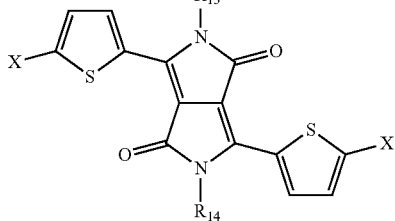

X = Cl, Br, I wherein X may be independently selected from one of Cl, Br, or I; each of $R_{13}$, $R_{14}$, $R_{15}$, $R_{16}$, $R_{17}$, $R_{18}$, $R_{19}$, and $R_{20}$ may be independently selected from one of hydrogen, C1-C30 alkyl, C2-C30 alkenyl, C1-C30 alkynyl, C2-C30 alkylcarbonyl, C1-C30 alkoxy, C1-C30 alkoxyalkyl, or C1-C30 alkoxycarbonyl.

In general, photocrosslinkable black electrochromic polymers are more desirable for various applications. The following scheme shows a structure of an example photocrosslinkable black electrochromic polymer:

Polymer II

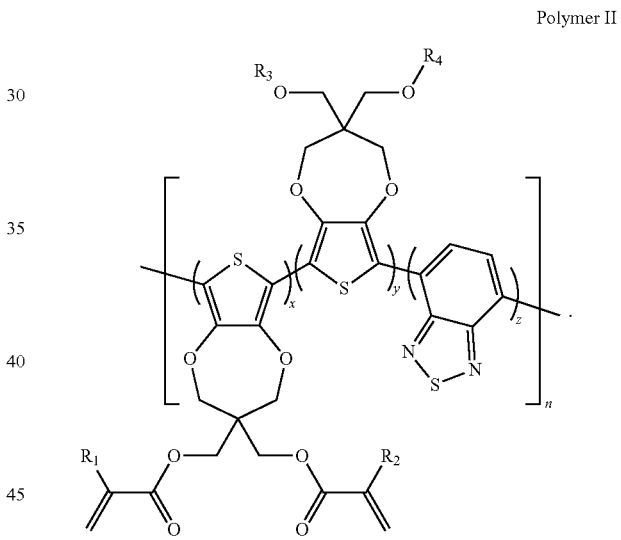

In Polymer II, n is an integer greater than 0. A number average molecular weight (Mn) of Polymer II ranges from 2,000 to 200,000. Each of R1, R2, R3, and R4 may be independently selected from one of hydrogen, C1-C30 alkyl, C2-C30 alkenyl, C1-C30 alkynyl, C2-C30 alkylcarbonyl, C1-C30 alkoxy, C1-C30 alkoxyalkyl, or C1-C30 alkoxycarbonyl. Further, x is an integer greater than 0; y is an integer greater than 0; z is an integer greater than 0. In some embodiments, the values of x, y and z may indicate ratios of different monomers, but not necessarily the real monomer sequence in the polymer. The polymer is in black color when x, y, and z satisfy the requirement of $0 < x/(y+z) \leq 0.6$ and $2 \leq y/z \leq 9$. The polymer may be formed from a random polymerization, which does not have accurate repeat units.

The photocrosslinkable electrochromic polymers may be prepared by a two-step synthesis method. The following scheme illustrates a two-step synthesis method according to one example embodiment.

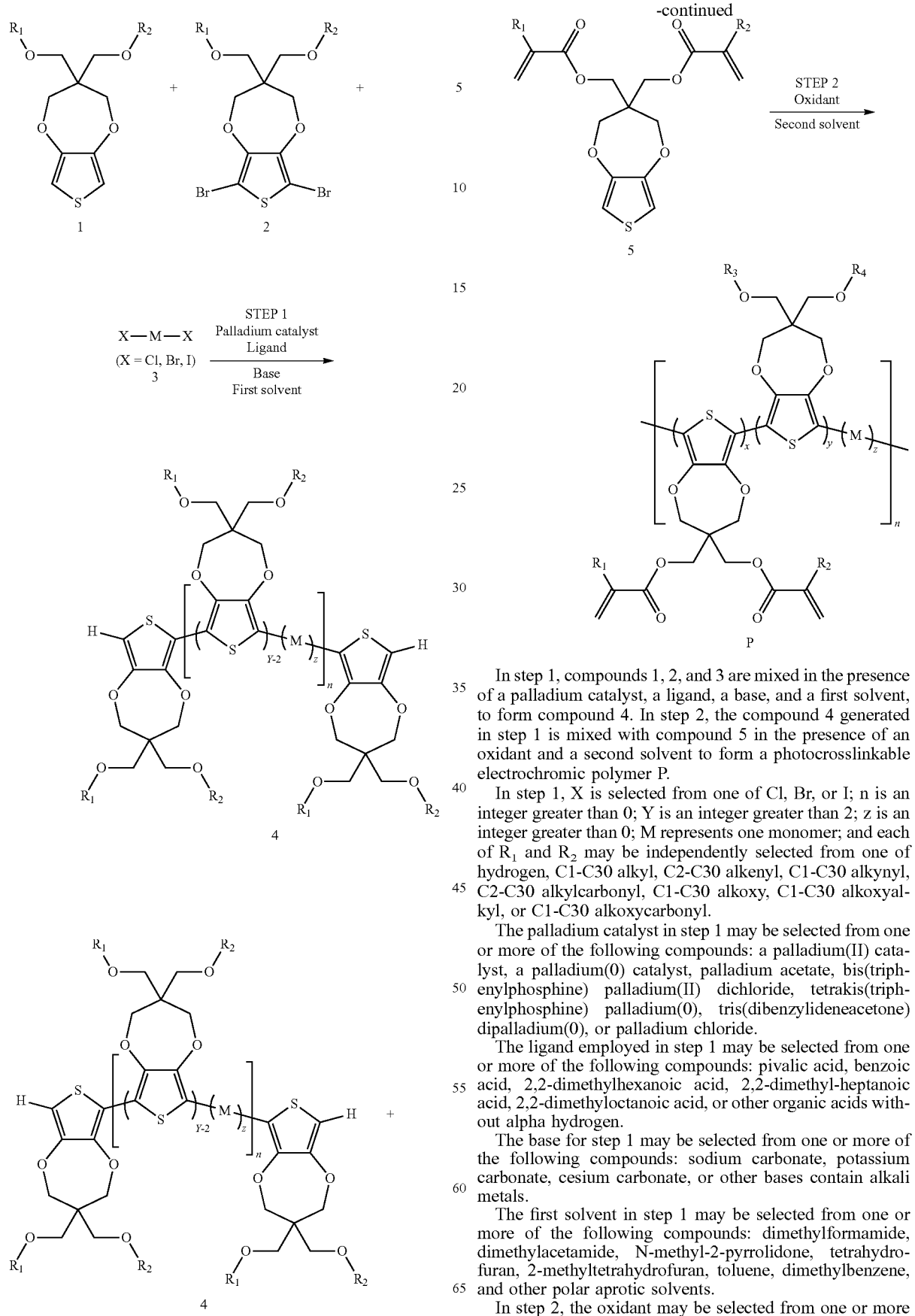

In step 1, compounds 1, 2, and 3 are mixed in the presence of a palladium catalyst, a ligand, a base, and a first solvent, to form compound 4. In step 2, the compound 4 generated in step 1 is mixed with compound 5 in the presence of an oxidant and a second solvent to form a photocrosslinkable electrochromic polymer P.

In step 1, X is selected from one of Cl, Br, or I; n is an integer greater than 0; Y is an integer greater than 2; z is an integer greater than 0; M represents one monomer; and each of $R_1$ and $R_2$ may be independently selected from one of hydrogen, C1-C30 alkyl, C2-C30 alkenyl, C1-C30 alkynyl, C2-C30 alkylcarbonyl, C1-C30 alkoxy, C1-C30 alkoxyalkyl, or C1-C30 alkoxycarbonyl.

The palladium catalyst in step 1 may be selected from one or more of the following compounds: a palladium(II) catalyst, a palladium(0) catalyst, palladium acetate, bis(triphenylphosphine) palladium(II) dichloride, tetrakis(triphenylphosphine) palladium(0), tris(dibenzylideneacetone) dipalladium(0), or palladium chloride.

The ligand employed in step 1 may be selected from one or more of the following compounds: pivalic acid, benzoic acid, 2,2-dimethylhexanoic acid, 2,2-dimethyl-heptanoic acid, 2,2-dimethyloctanoic acid, or other organic acids without alpha hydrogen.

The base for step 1 may be selected from one or more of the following compounds: sodium carbonate, potassium carbonate, cesium carbonate, or other bases contain alkali metals.

The first solvent in step 1 may be selected from one or more of the following compounds: dimethylformamide, dimethylacetamide, N-methyl-2-pyrrolidone, tetrahydrofuran, 2-methyltetrahydrofuran, toluene, dimethylbenzene, and other polar aprotic solvents.

In step 2, the oxidant may be selected from one or more of the following compounds: iron(III) chloride, iron(III)

bromide, iron(III) sulfate, iron(III) nitrate, dibenzoyl peroxide, di-tert-butyl peroxide, other iron(III) salts, peroxide salt, or persulfate salt.

The second solvent in step 2 may be selected from one or more of the following compounds: chloroform, dichloromethane, nitromethane, toluene, and other aprotic solvents.

Each of $R_3$ and $R_4$ may be independently selected from one of hydrogen, C1-C30 alkyl, C2-C30 alkenyl, C1-C30 alkynyl, C2-C30 alkylcarbonyl, C1-C30 alkoxy, C1-C30 alkoxyalkyl, or C1-C30 alkoxycarbonyl. In step 2, y is an integer greater than 0. In some embodiments, the two-step synthesis method may be a random polymerization method, such that repeat units in the photocrosslinkable electrochromic polymers are not strictly alternating.

In an example step 1 reaction, more than 1.0 equivalent of 3,4-propylenedioxythiophene (ProDOT) (corresponding to compound 1), 0-1.0 equivalent of dibromo-3,4-propylenedioxythiophene (2Br-ProDOT) (corresponding to compound 2), and 1.0-0 equivalent of monomer M (corresponding to compound 3) are placed into a flask. In this example, compound 2+compound 3=1.0 equivalent. $K_2CO_3$ (2.6 equivalent), PivOH (0.3 equivalent), and $Pd(OAc)_2$ (0.02 equivalent) are also added into the flask. The flask is kept under vacuum for about 15 minutes and then purged with $N_2$. The above process is repeated for three cycles. Then, nitrogen degassed N-Methyl pyrrolidone solvent is added into the flask to form a mixture, which is heated to 140° C. for 20 hours under nitrogen. The hot reaction mixture is transferred to a 1:1 solvent mixture of $CH_3OH$ and 1M HCl with stirring. The combined mixture is then filtered to obtain the solid content. The solid content is dissolved in chloroform and washed with 1M HCl to form a solution. The organic phase of the solution is concentrated and precipitated with $CH_3OH$, filtered, and air dried to obtain a polymer compound (e.g., compound 4), which may be used as a polymer precursor for a step 2 reaction. The yield ranges from 70 to 98%.

In an example step 2 reaction, the polymer precursors from the step 1 (compound 4) and photocrosslinkable monomers (compound 5) are added into a flask and dissolved with choloroform. Iron(III) chloride nitromethane solution is added into the flask to form a solution with stirs at the room temperature. Water and chloroform are employed to wash away the iron chloride. The chloroform phase is collected, and hydrazine hydrate is added. The chloroform solution phase is washed with water and 1N HCl solution sequentially. The chloroform solution is added into methanol to precipitate the polymer contained therein. The solution is then filtered and air dried to obtain a photocrosslinkable electrochromic polymer (polymer P). The yield ranges from 70 to 95%.

Another example two-step synthesis method to form a photocrosslinkable electrochromic polymer is provided hereinafter. An example step 1 reaction is shown below:

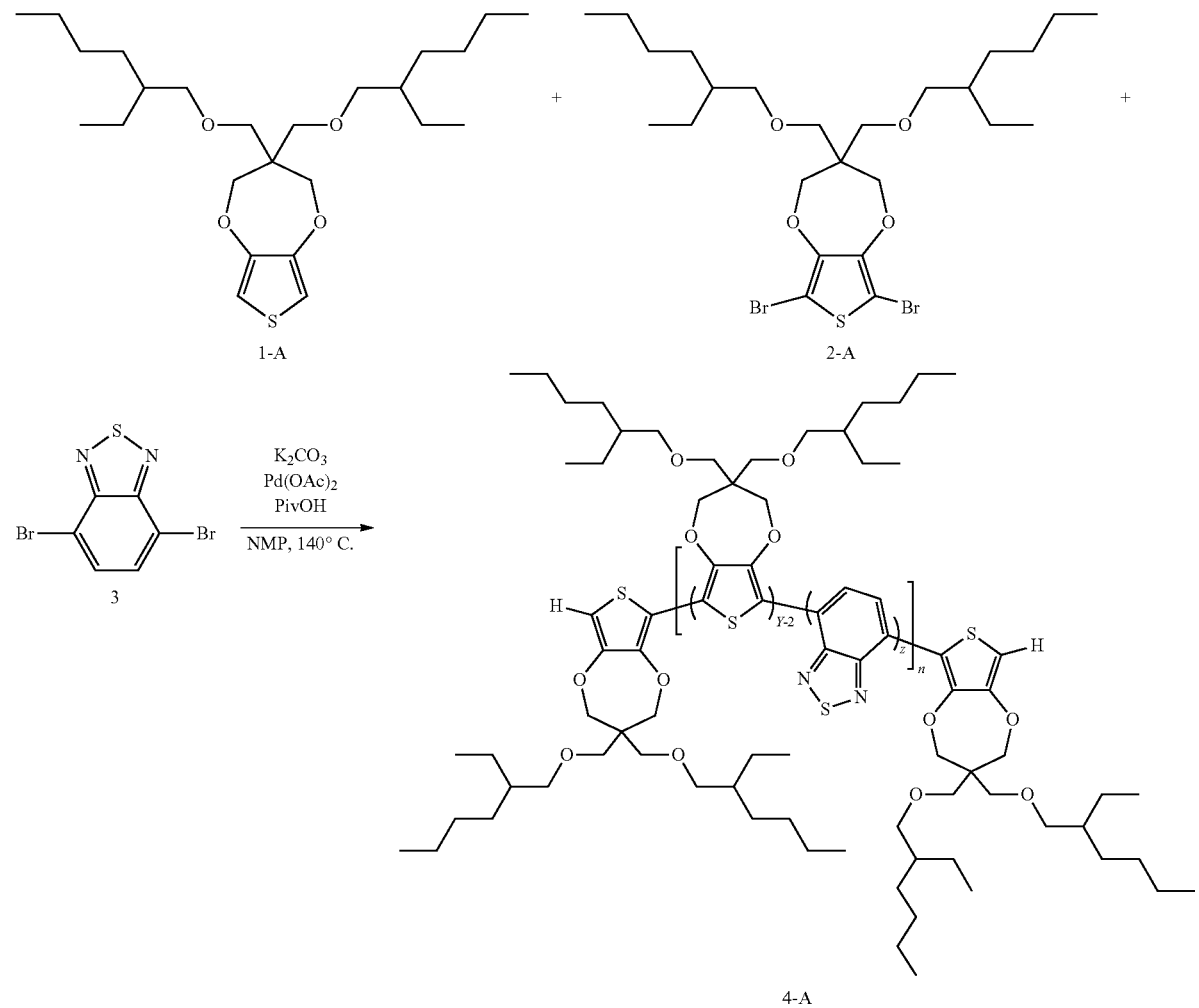

In this example, compounds 1-A, 2-A, and 3 are mixed in the presence of K$_2$CO$_3$, Pd(OAc)$_2$, PivOH, and N-Methyl-2-pyrrolidone (NMP) to form a polymer precursor 4-A. For example, to synthesize polymer 4-A, a mixture including 3,3-bis(((2-ethylhexyl)oxy)methyl)-3,4-dihydro-2H-thieno[3,4-b][1,4]dioxepine (0.24 g, 1.2 equivalent (eq.)), 6,8-dibromo-3,3-bis(((2-ethylhexyl)oxy)methyl)-3,4-dihydro-2H-thieno[3,4-b][1,4]dioxepine (0.18 g, 0.65 eq.), 4,7-Dibromo-2,1,3-benzothiadiazole (0.047 g, 0.35 eq.), K$_2$CO$_3$ (0.16 g, 2.6 eq.), PivOH (0.014 g, 0.3 eq.), and Pd(OAc)$_2$ (0.002 g, 0.02 eq.) is added to a Schlenk flask. The flask is kept under vacuum for about 15 min and then purged with N$_2$. The above process is repeated for three cycles. Then, nitrogen degassed solvent NMP 7.2 ml is added to the flask, and the flask is heated in an oil bath at 140° C. for 24 h under nitrogen. The hot reaction mixture is transferred to a 1:1 mixture solvent of CH$_3$OH and 1M HCl with stirs to form a solution. The solution is filtered to obtain the solid content. The solid content is dissolved in chloroform and washed with 1M HCl to form a solution. The organic phase of the solution is concentrated and precipitated with CH$_3$OH, filtered, and dried to obtain about 0.28 g polymer precursor 4-A. The yield is about 70%. The polymer precursor has a number average molecular weight (M$_n$) of 6.3 kDa and a polydispersity index (PDI) of 1.4. When subject to a nuclear magnetic resonance (NMR) spectroscopy under the following examination conditions: $^1$H NMR (400 MHz, CDCl$_3$), chemical shift data (δ) for the polymer precursor are (ppm): 8.45-8.31 (m, 1H), 6.69-6.38 (m, 0.24H), 4.33-4.06 (m, 7.9H), 3.63-3.30 (m, 16.8H), 1.53-0.9 (m, 57.7H).

The compound 4-A generated from the example step 1 reaction is used, in an example step 2 reaction, as the polymer precursors to react with 0.1 or 0.2 weight ratio of acrylated ProDOT monomer (5-A) via oxidative polymerization, to generate two different final photocrosslinkable black ECPs (P1 and P2). The example step 2 reaction is shown below.

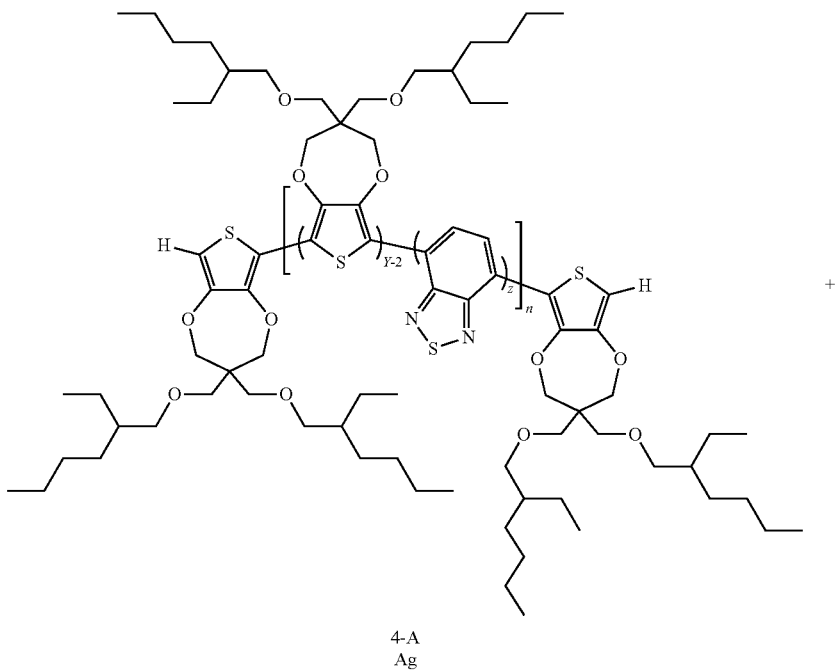

4-A
Ag

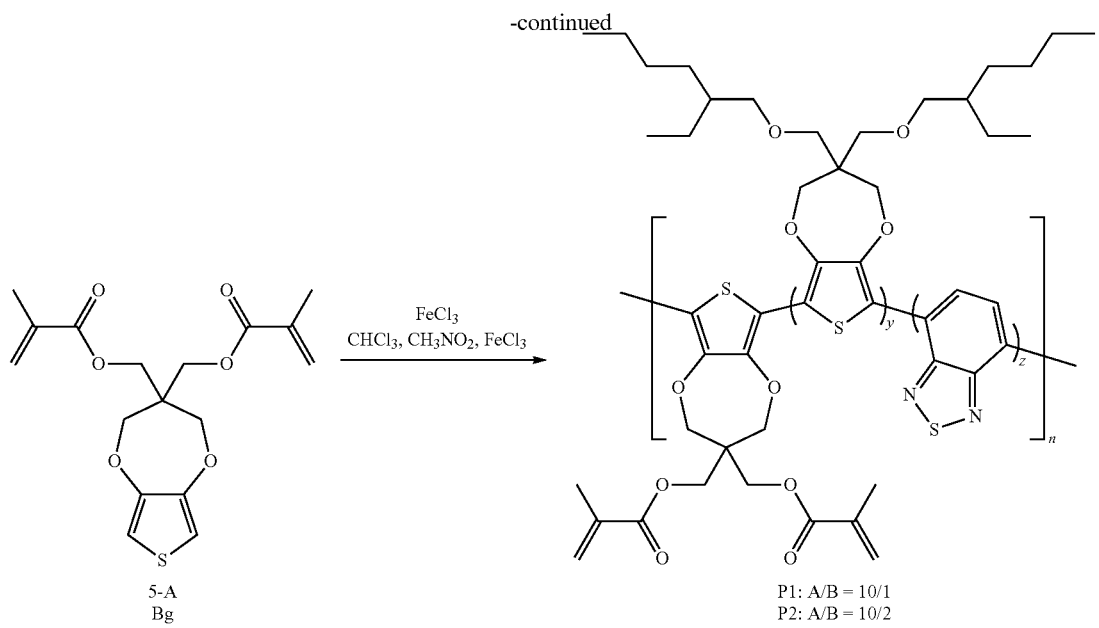

P1: A/B = 10/1
P2: A/B = 10/2

Figure 2:
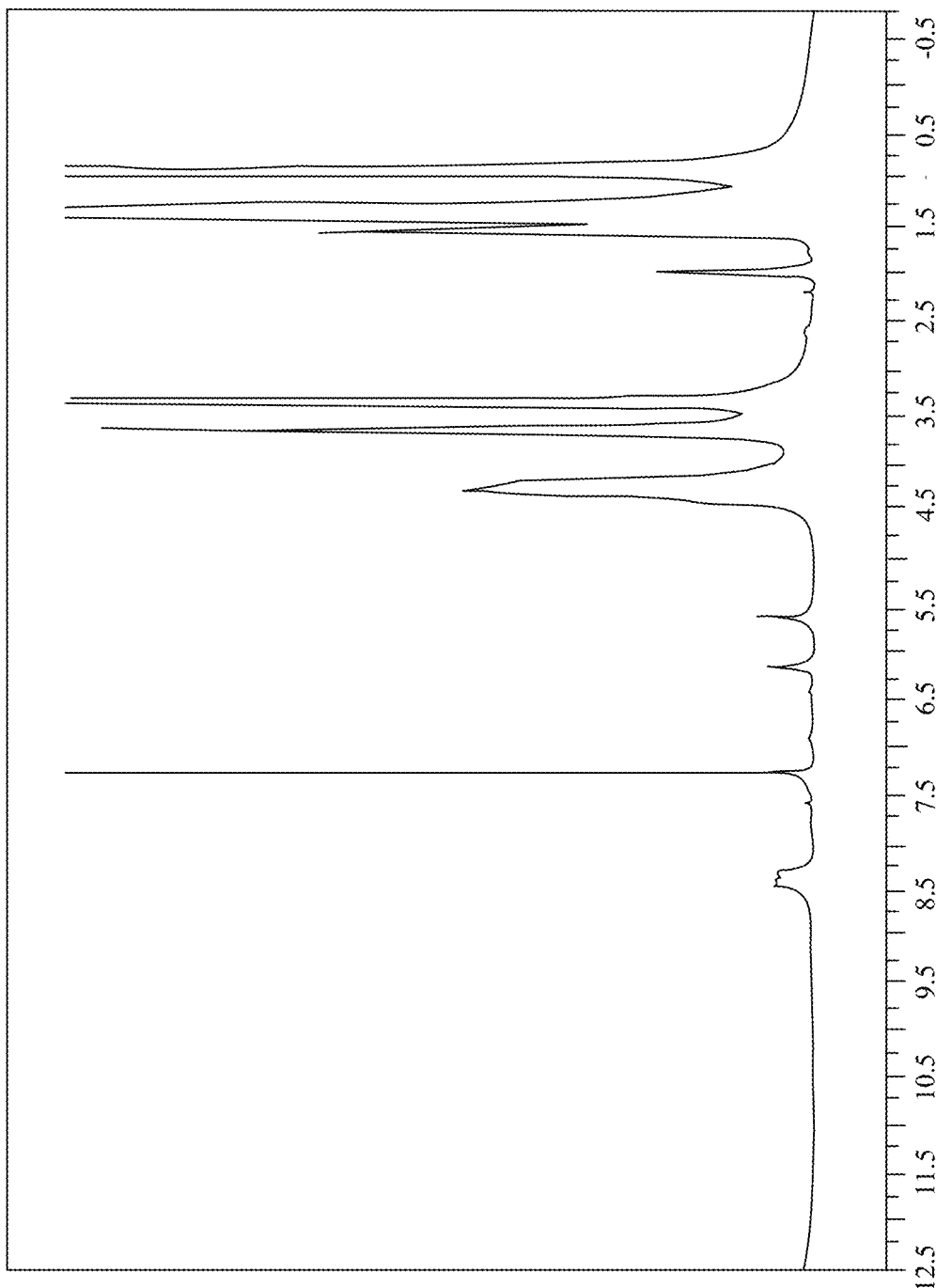
FIG. 2 is an NMR spectrum for a first polymer, according to one example embodiment.
Figure 3:
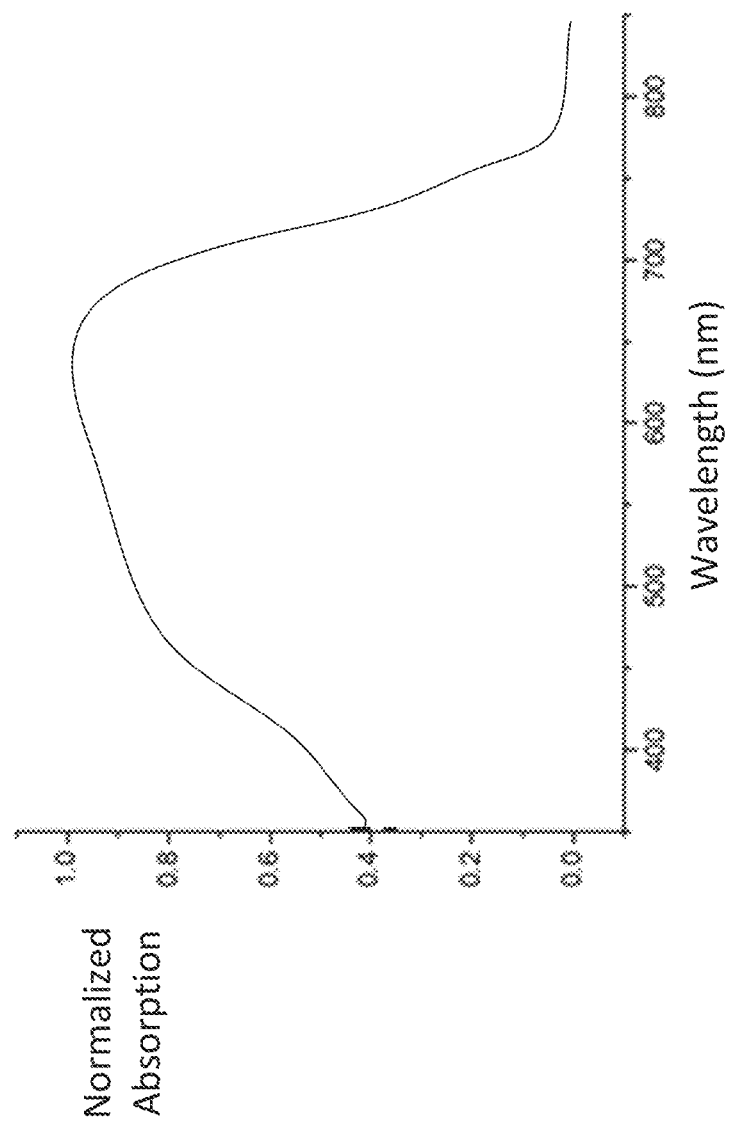
FIG. 3 is a UV absorption spectrum for the first polymer.

To form polymer P1, a mixture of polymer precursor 4-A (0.28 g) and (3,4-dihydro-2H-thieno[3,4-b][1,4]dioxepine-3,3-diyl)bis(methylene) bis(2-methylacrylate) (0.028 g) is added to a round bottom flask. The mixture is dissolved with 10 mL of chloroform. Dissolved iron(III) chloride (0.65 g, 10 eq) in 5 mL nitromethane is then added into the flask. The solution is stirred for 17 hours at the room temperature. The iron chloride is then washed away with 20 mL of water and chloroform. The chloroform phase is collected and mixed with 1 mL hydrazine hydrate. After being stirred for 20 minutes, the solution is washed with 20 mL water and 20 mL 1N HCl solution. The chloroform solution is mixed with 150 mL of methanol to precipitate the polymer, which is filtered and air dried to obtain about 0.24 g of polymer P1. The yield is about 77%. When subject to an NMR spectroscopy under the following examination conditions: $^1$H NMR (300 MHz, CDCl$_3$), the chemical shift data (δ) for the polymer P1 are (ppm): 8.45-8.34 (m, 2H), 6.15 (s, 0.49H), 5.63 (s, 0.48H), 4.25-3.34 (m, 58H), 1.97-0.9 (m, 137H). FIG. 2 is an NMR spectrum for the polymer P1. The peaks at 6.15 ppm and 5.63 ppm indicate the existence of acrylate double bond. This means that the two-step synthesis method successfully introduces the photocrosslinkable sidechains into the black polymer. FIG. 3 is a UV absorption spectrum for the polymer P1. A wide absorption across the visable light region indicates the balck color of the polymer P1.

Figure 4:
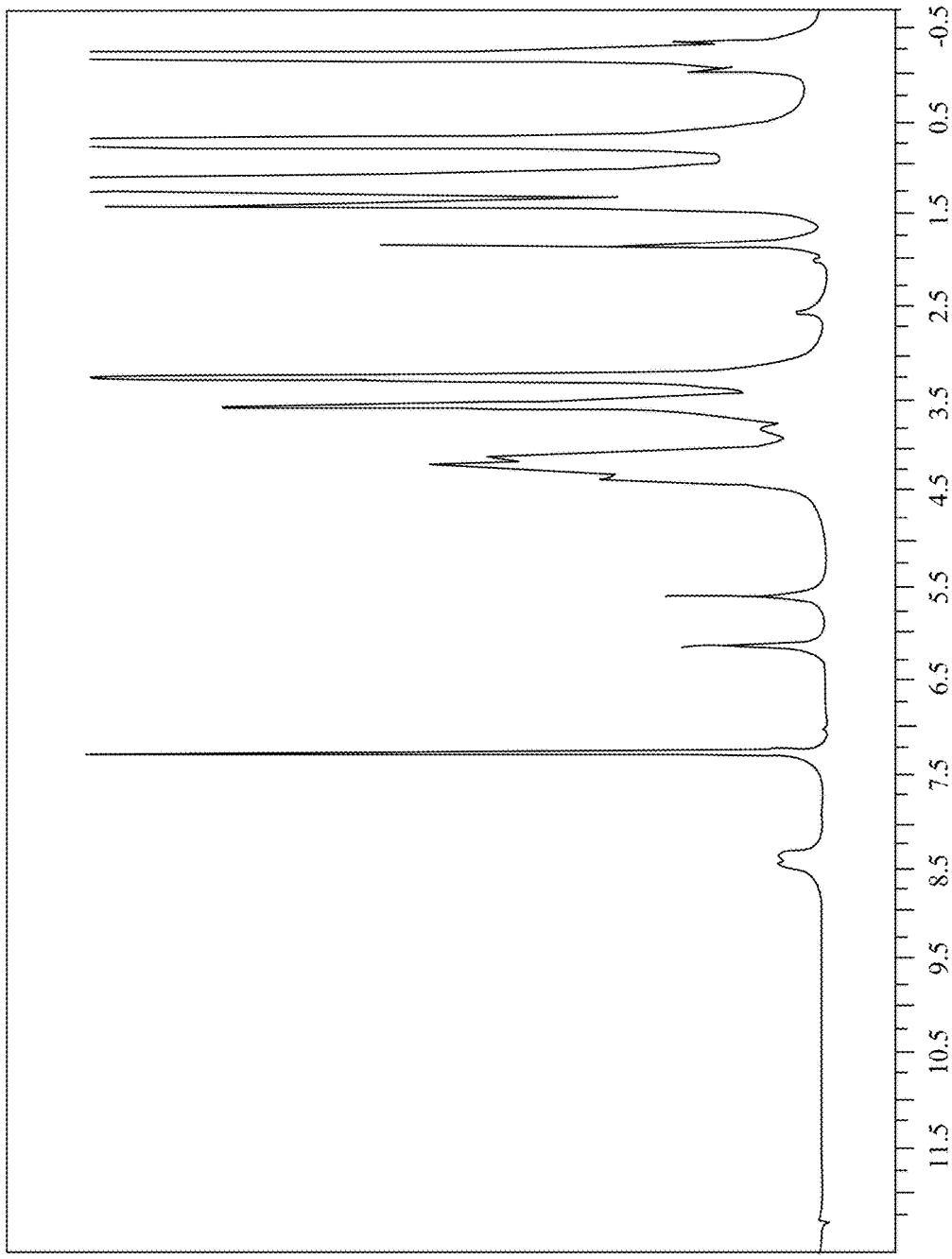
FIG. 4 is an NMR spectrum for a second polymer, according to one example embodiment.
Figure 5:
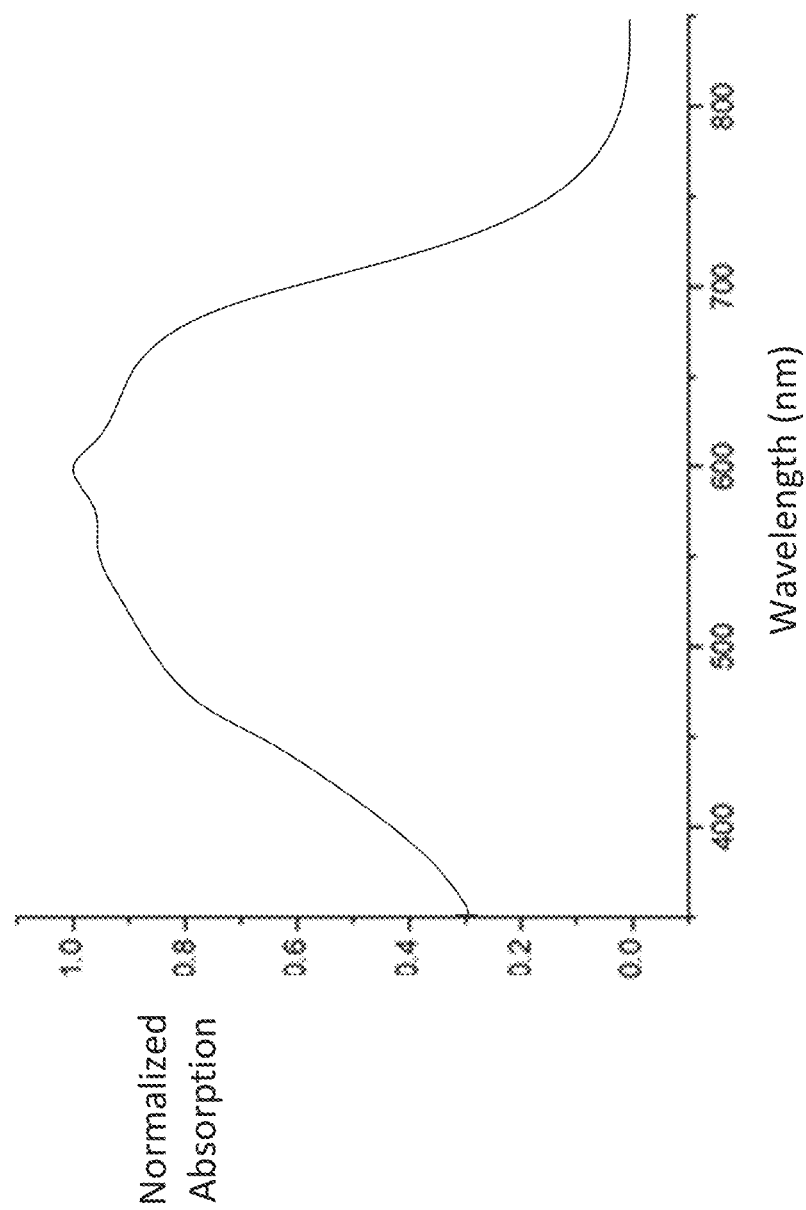
FIG. 5 is a UV absorption spectrum for the second polymer.

To form polymer P2, a mixture of polymer precursor 4-A (0.28 g) and (3,4-dihydro-2H-thieno[3,4-b][1,4]dioxepine-3,3-diyl)bis(methylene) bis(2-methylacrylate) (0.056 g) is added to a round bottom flask. The mixture is dissolved with 10 mL of chloroform. Dissolved iron(III) chloride (0.65 g, 10 eq) in 5 mL nitromethane is added into the flask. The solution is stirred for 17 hours at the room temperature. The iron chloride is then washed away with 20 mL of water and chloroform. The chloroform phase is collected and mixed with 1 mL hydrazine hydrate. After being stirred for 20 minutes, the solution is washed with 20 mL water and 20 mL 1N HCl solution. The chloroform solution is added into 150 mL of methanol to precipitate the polymer, which is filtered and air dried to obtain about 0.29 g of polymer P2. The yield is about 86%. When subject to an NMR spectroscopy under the following examination conditions: $^1$H NMR (400 MHz, CDCl$_3$), the chemical shift data (δ) for the polymer P1 are (ppm): 8.45-8.34 (m, 2H), 6.15 (s, 0.4H), 5.63 (s, 1.34H), 4.41-3.34 (m, 52.7H), 1.97-0.9 (m, 128.1H). FIG. 4 is an NMR spectrum for the polymer P2. The peaks at 6.15 ppm and 5.63 ppm indicate the existence of acrylate double bond, which means that the two-step synthesis method successfully introduces the photocrosslinkable sidechains into the black polymer. FIG. 5 is a UV absorption spectrum for the polymer P2. A wide absorption across the visable light region indicates the balck color of the polymer P2.

The photocrosslinkable polymers formed with the disclosed two-step synthesis methods may be used to form a solid electrochromic layer for an electrochromic device. The photocrosslinkable polymers may be employed so that an electrochromic layer may be patterned using UV light into a desired shape and size. For example, due to the higher content of acrylated functional groups, polymer P2 described above may be employed to blend with crosslinking agents (PEGDA$_{700}$/EGDMA) in various ratios to form a crosslinked network. For example, to form a crosslinking network with the acrylated ECPs, a crosslinking agent of PEGDA$_{700}$/EGDMA in a ratio of 1:1 is used as a matrix to crosslink with polymer P2.

In one example, polymer P2 is dissolved in CHCl$_3$ solvent overnight to obtain a solution with a concentration of 40 mg/ml. For polymer blends, a certain ratio (e.g., 33%, 66%, or 80%) of the P2 and the crosslinking agent which are made of a 1 to 1 ratio of EGDMA and PEGDA$_{700}$ with 10 wt % of the initiator (AIBN or HMP) are mixed to form polymer blends with various blend ratios. The polymer blends are spin-coated at a spin speed of 1500 rpm on substrates to form thin films. In a crosslinking process, the thin films of P2 polymer blends are transferred into nitrogen gas-filled glove box and exposed, for 10 minutes, to UV lamps that emit light at both 365 and 405 nm. A photo-mask can be used to create patterns during the crosslinking process. The UV-light exposed thin films are immersed into the CHCl$_3$ solvent to remove the un-crosslinked area not exposed to the UV light to create the pattern with the crosslinked thin film.

Figure 6:
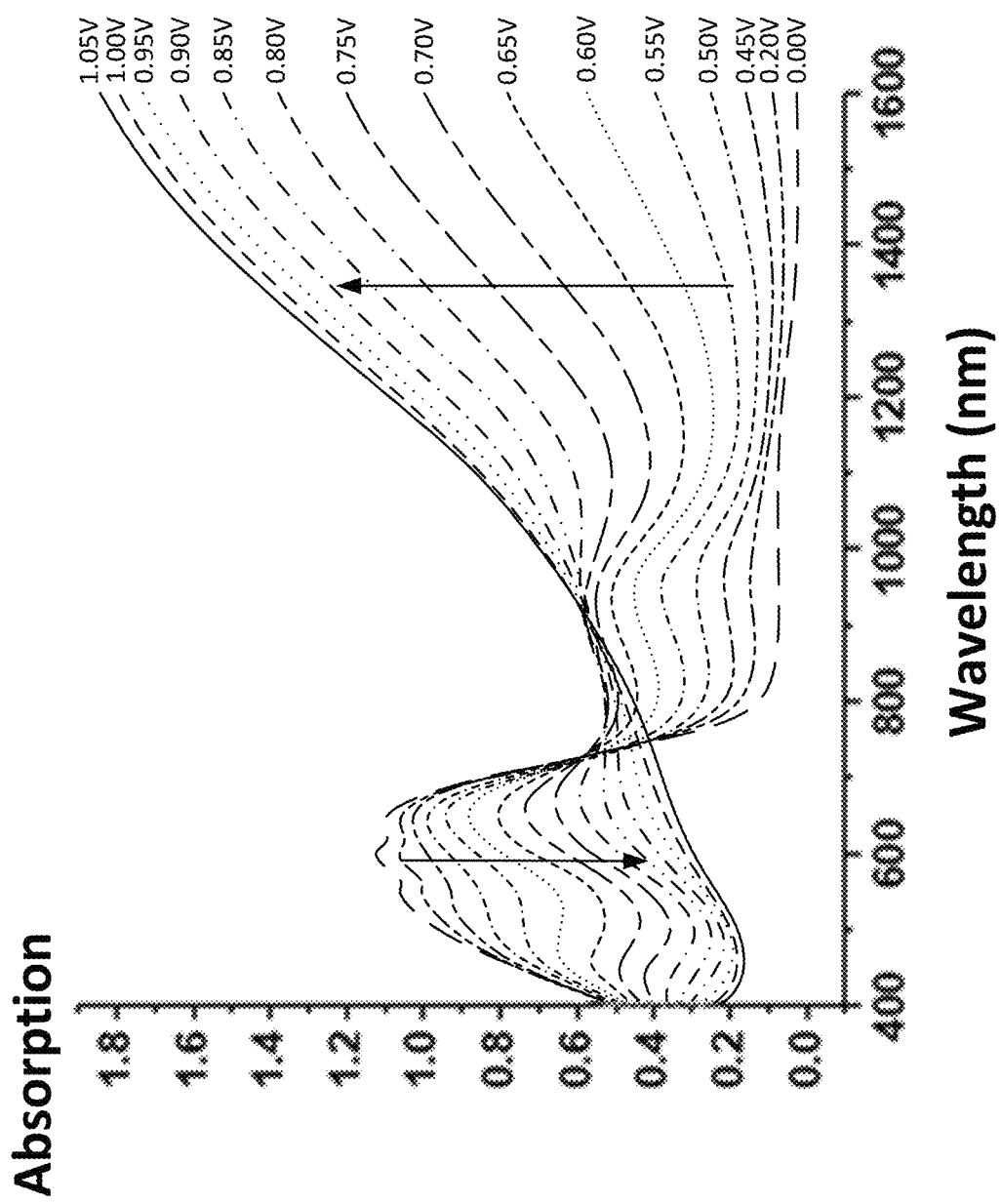
FIG. 6 shows results of a spectroelectrochemical analysis for a thin film formed with the second polymer before photocrosslinking, according to one example embodiment.
Figure 7:
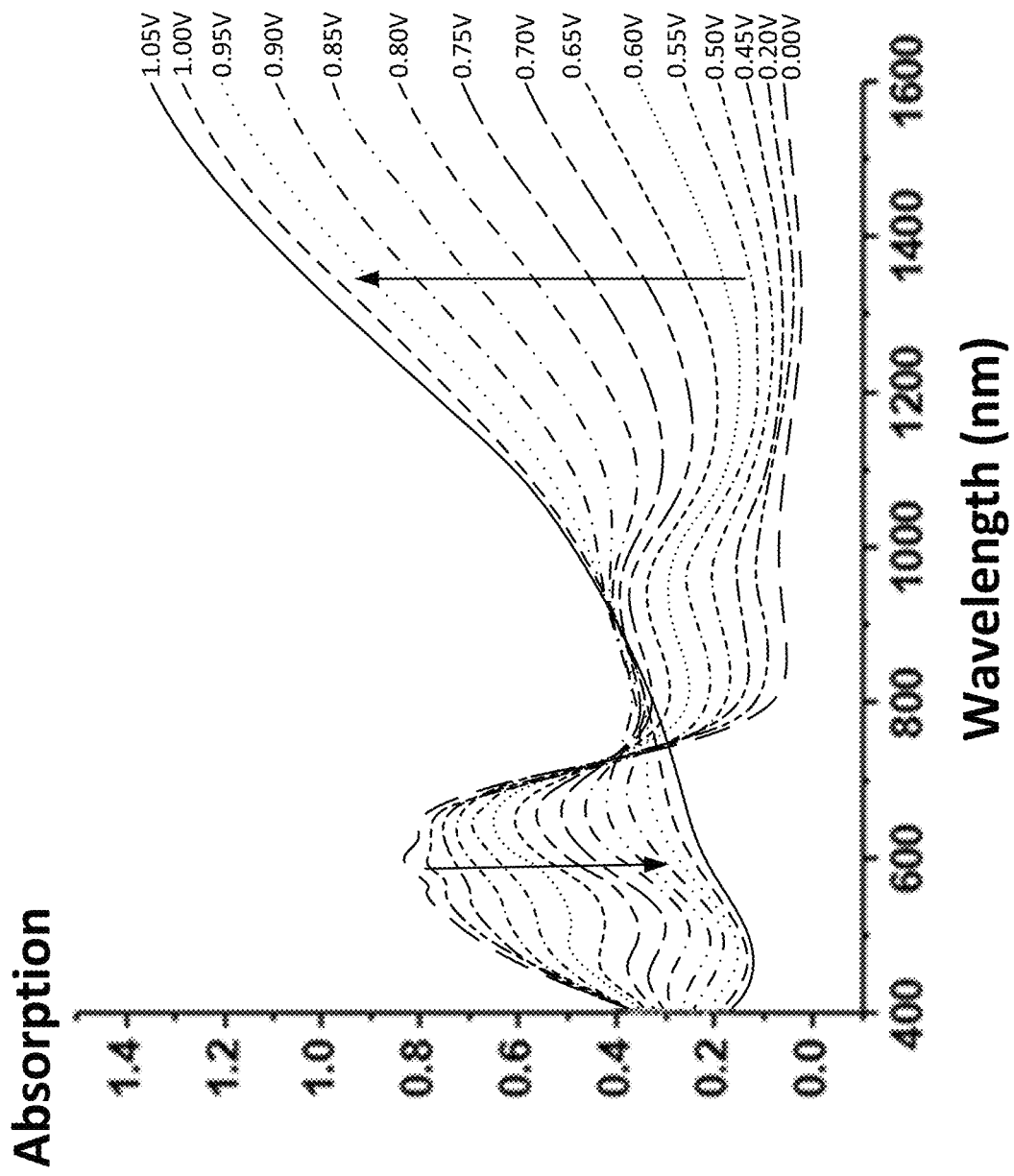
FIG. 7 shows results of a spectroelectrochemical analysis for a thin film formed with the second polymer after photocrosslinking, according to one example embodiment.

The crosslinked, patterned thin films exhibit good electrochromic characteristics. For example, the thin films can change from black to colorless with electrically controlled signals. FIG. 6 shows results of a spectroelectrochemical analysis for a polymer P2 thin film before photocrosslinking, according to one example embodiment. As shown in FIG. 6, when a voltage in incremental steps from 0.00V to 1.05V is applied to the pre-crosslinked thin film, the visible light absorption of polymer decreases and the near IR absorption increases as the applied voltage increases. The color of the thin film changes from black to colorless as the applied voltage increases. FIG. 7 shows results of a spectroelectrochemical analysis for a polymer P2 thin film after photocrosslinking, according to one example embodiment. As shown in FIG. 7, when a voltage in incremental steps from 0.00V to 1.05V is applied to the crosslinked thin film, the visible light absorption of polymer decreases and the near IR absorption increases as the applied voltage increases. The color of the thin film changes from black to colorless as the applied voltage increases. As illustrated in FIGS. 6 and 7, the electrochromic characteristics of the thin films containing polymer P2 remain effective after the photocrosslinking process.

In some embodiments, a ratio of the photocrosslinkable electrochromic polymers to crosslinking agents is controlled to be greater than 33% and less than 80%. For example, it is discovered that a thin film of the pure polymer P2 shows a smooth surface topology with a roughness of 0.21 nm. When P2 is blended and crosslinked with the EGDMA/PEGDA$_{700}$, small aggregation domains may start to form and be randomly distributed in the 80% P2 blends and the roughness of the thin film is increased to 0.35 nm. The evenly distributed aggregation domains appear in the thin film formed from the 66% P2 blends and the roughness is about 0.43 nm. With the higher content of the crosslinking agent, the aggregation becomes larger in the thin film formed from 33% P2 blends with the roughness of 0.53 nm. The interaction of the crosslinking agents can be controlled to achieve the photo-patternable thin films containing polymer P2 without compromising their electrochemical properties. In some instances, due to the sparsely formed crosslinking domains in the thin film of 80% P2 blends, the crosslinking matrix may not be able to react with the acrylated functional groups of the polymer P2. After washed with chloroform ($CHCl_3$) solvent, the thin film loses about 57% of the optical density at 585 nm, which indicates that the 80% P2 blend may not be suitable for the photopatterning applications. Increasing the fraction of the crosslinking agent to form uniform small crosslinking aggregations enables that the acrylated functional groups of the polymer P2 can thoroughly react with the crosslinking matrix.

In some embodiments, the formation of the small aggregation domains in the thin films after crosslinking may have slightly impact on the ionic diffusion in the electrochemistry, which is essential to their electrochromic properties. For polymer blends with 33% of the polymer P2, the formation of the large aggregation domains could lead to poor electrical and ionic conductivity of the thin films. As a result, the 33% P2 may not be suitable for forming an electrochromic thin film for an electrochromic device.

In one example, the percentage of the polymer P2 in EGDMA/PEGDA$_{700}$ is varied to form 33%, 66%, and 80% P2 polymer blends. Among these three different blending ratios, 66% P2 blend is found to have better electrochromic properties than the other two blends.

Figure 8:
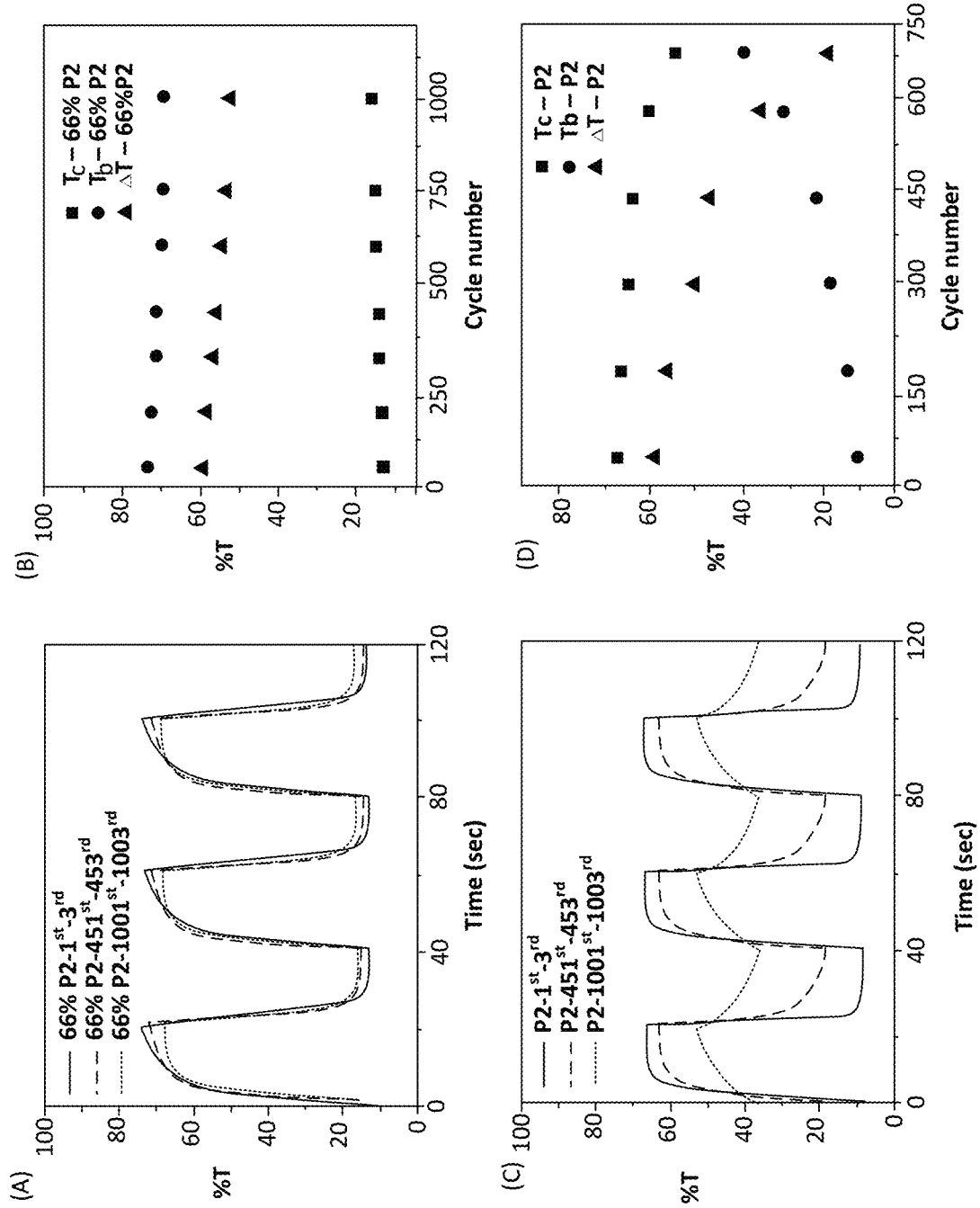
FIG. 8(A) is a double-potential step chronoabsorptiometry (DPSC) test result of a thin film formed with 66% P2 polymer blend, according to one example embodiment.
FIG. 8(B) is a diagram showing transmittance at colored and bleached states and the optical contrast at different cycle numbers of the thin film tested in FIG. 8(A).
FIG. 8(C) is a DPSC test result of a thin film with pure P2 polymer, according to one example embodiment.
FIG. 8(D) is a diagram showing transmittance at colored and bleached states and the optical contrast at different cycle number of the thin film tested in FIG. 8(C).

Delamination of the hydrophobic thin-films of ECPs often occurs when the thin films are immersed in the polar electrolytes, e.g. propylene carbonates, acetonitrile, ethyl carbonate. The crosslinking of the ECPs can increase the adhesion of the thin films on the ITO/glass substrate, resulting in a better cycle stability. In one example, the cycling stability of thin films of both pure P2 and 66% P2 blend is investigated by double-potential step chronoabsorptiometry (DPSC) in which the thin films are switched between 1.0 and −0.2 V vs. Ag/AgCl with a pulse width of 20 s. Results of the DPSC tests are shown in FIGS. 8(A)-8(D). FIG. 8(A) is a DPSC test result of a thin film with 66% P2 blend, according to one example embodiment. FIG. 8(B) is a diagram showing transmittance at colored and bleached states and the optical contrast at different cycle numbers of the thin film with the 66% P2 blend, where Tc is light transmittance in the colorless state, Tb is light transmittance in the black state, and ΔT is the light transmittance difference between the colorless state and the black state. FIG. 8(C) is a DPSC test result of a thin film with pure P2, according to one example embodiment. FIG. 8(D) is a diagram showing transmittance at colored and bleached states and the optical contrast at different cycle numbers of the thin film with pure P2.

The thickness of the thin film with 66% P2 blend is measured to be 489.0±30.8 nm. As shown in FIGS. 8(B) and 8(D), the ΔT % of the 66% P2 blend is 60% at the initial cycle and can maintain at 88% of the initial 60% up to 1000 cycles. In contrast, the thin film with the pure P2 with a thickness of 579.2±39.4 nm lost 71% of its original contrast after 700 cycles. The crosslinking strategy is found to benefit the cycle stability of the ECPs.

A two-step synthesis method is provided for preparing photocrosslinkable electrochemical polymers with various colors, such as photocrosslinkable black electrochemical polymers, which are highly desired and most acceptable for various applications in industry. The prepared photocrosslinkable electrochemical polymers not only maintain the good electrochemical and electrochromic properties, but also improve cycle stabilities of electrochromic devices.

The foregoing description of the present invention has been provided for the purposes of illustration and description. It is not intended to be exhaustive or to limit the invention to the precise forms disclosed. The breadth and scope of the present invention should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A polymer comprising a formula of:

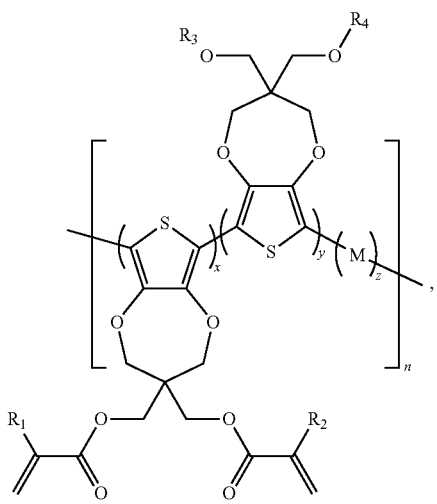

wherein n is an integer greater than 0; x is an integer greater than 0; y is an integer greater than 0;

z is an integer greater than 0; M is a monomer unit; and each of $R_1$, $R_2$, $R_3$ and $R_4$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl; and wherein M is selected from a group including:

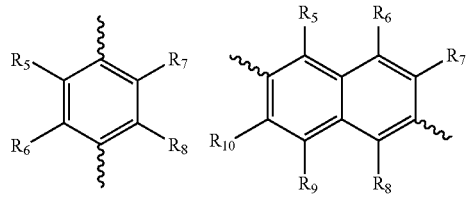

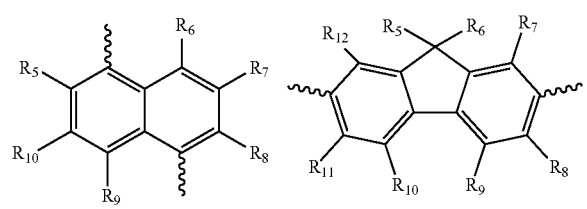

wherein the wavy line represents a single covalent bond, and each of $R_5$, $R_6$, $R_7$, $R_8$, $R_9$, $R_{10}$, $R_{11}$, and $R_{12}$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl.

2. The polymer of claim 1, wherein M is incorporated into the polymer using a compound selected from a group comprising of:

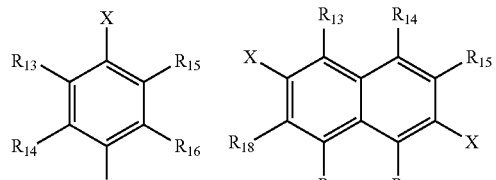

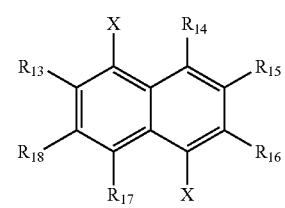

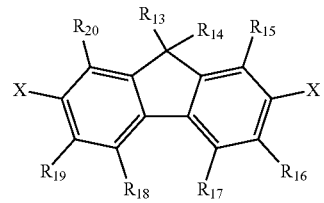

wherein X is selected from one of Cl, Br, or I; and each of $R_{13}$, $R_{14}$, $R_{15}$, $R_{16}$, $R_{17}$, $R_{18}$, $R_{19}$, and $R_{20}$ is independently selected from one of hydrogen, C1-C30 alkyl, C2-C30 alkenyl, C2-C30 alkynyl, C2-C30 alkylcarbonyl, C1-C30 alkoxy, C1-C30 alkoxyalkyl, or C2-C30 alkoxycarbonyl.

3. The polymer of claim 1, wherein a number average molecular weight of the polymer is from 2,000 to 200,000 Da.

4. A method for forming the polymer of claim 1, the method comprising:

forming a polymer precursor with one or more chromophore blocks; and mixing the polymer precursor with photocrosslinkable monomer units under conditions sufficient to form the polymer.

5. The method of claim 4, wherein forming the polymer precursor with the one or more chromophore blocks comprises contacting a monomer of formula IA, a monomer of formula IB, and a monomer of formula IC:

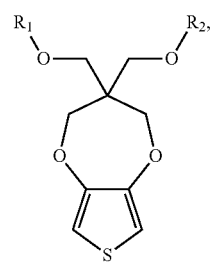

IA

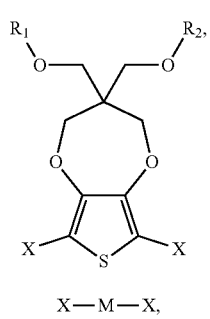

IB

X—M—X,

IC under first reaction conditions sufficient to provide the polymer precursor, wherein the polymer precursor is of formula ID:

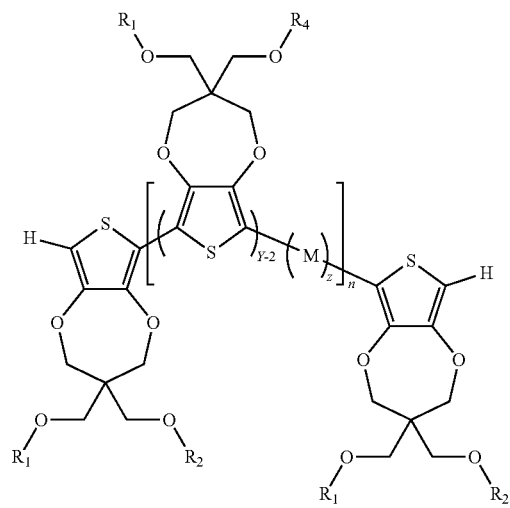

ID wherein X is selected from one of Cl, Br, or I; n is an integer greater than 0; Y is an integer greater than 2.

6. The method of claim 5, wherein the first reaction conditions comprise a palladium catalyst, a ligand, a base, and a first solvent.

7. The method of claim 6, wherein the palladium catalyst is selected from one of a palladium(II) catalyst, a palladium (0) catalyst, palladium acetate, bis(triphenylphosphine) palladium(II) dichloride, tetrakis(triphenylphosphine) palladium(0), tris(dibenzylideneacetone) dipalladium(0), or palladium chloride.

8. The method of claim 6, wherein the ligand is selected form one of pivalic acid, benzoic acid, 2,2-dimethylhexanoic acid, 2,2-dimethylheptanoic acid, 2,2-dimethyloctanoic acid, or an organic acid without an alpha hydrogen.

9. The method of claim 6, wherein the base is selected from one of sodium carbonate, potassium carbonate, cesium carbonate, and a base containing an alkali metal.

10. The method of claim 6, wherein the first solvent is selected form one or more of dimethylformamide, dimethylacetamide, n-methyl-2-pyrrolidone, tetrahydrofuran, 2-methyltetrahydrofuran, toluene, dimethylbenzene, or a polar aprotic solvent.

11. The method of claim 5, wherein mixing the polymer precursor with the photocrosslinkable monomer units comprises contacting the polymer precursor of formula ID with a photocrosslinkable monomer of formula IE:

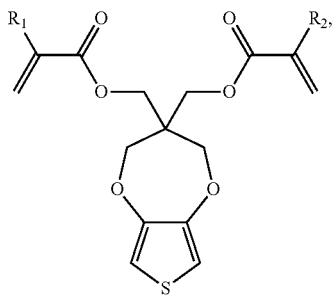

IE under second reaction conditions sufficient to form the polymer

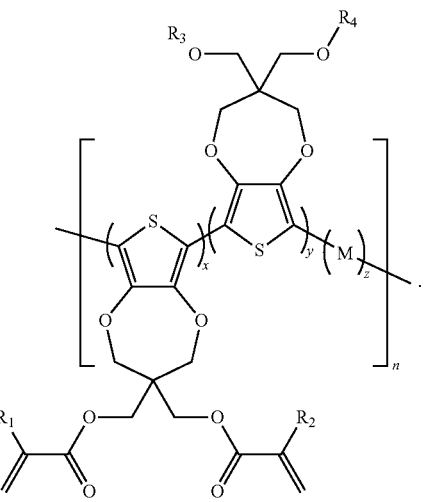

12. The method of claim 11, wherein the second reaction conditions comprise an oxidant and a second solvent.

13. The method of claim 12, wherein the second solvent is selected form one or more of chloroform, dichloromethane, nitromethane, toluene, or an aprotic solvent.

14. The method of claim 12, wherein the oxidant is selected from one or more of dibenzoyl peroxide, di-tert-butyl peroxide, an iron(III) salt, peroxide salt, or persulfate salt.

15. The method of claim 14, wherein the iron(III) salt includes one or more of iron(III) chloride, iron(III) bromide, iron(III) sulfate, or iron(III) nitrate.

16. An electronic device comprising the polymer of claim 1.

* * * * *

UNITED STATES PATENT AND TRADEMARK OFFICE
CERTIFICATE OF CORRECTION

PATENT NO. : 11,111,321 B2
APPLICATION NO. : 16/942000
DATED : September 7, 2021
INVENTOR(S) : Liyan You, Jiazhi He and Jianguo Mei It is certified that error appears in the above-identified patent and that said Letters Patent is hereby corrected as shown below:

In the Claims

In Claim 13, Column 30, Line 50, "selected form one or more" should read --selected from one or more--.

Signed and Sealed this
Fifteenth Day of February, 2022

Drew Hirshfeld
*Performing the Functions and Duties of the
Under Secretary of Commerce for Intellectual Property and
Director of the United States Patent and Trademark Office*